United States Patent
Kull et al.

(10) Patent No.: US 12,341,527 B2
(45) Date of Patent: Jun. 24, 2025

(54) UNIT CAPACITOR-BASED RAMP ANALOG-TO-DIGITAL CONVERTER

(71) Applicant: Cisco Technology, Inc., San Jose, CA (US)

(72) Inventors: Lukas Kull, Cham (CH); Thomas H. Toifl, Gattikon (CH); Danny Chen-Hsien Luu, Zurich (CH)

(73) Assignee: CISCO TECHNOLOGY, INC., San Jose, CA (US)

( * ) Notice: Subject to any disclaimer, the term of this patent is extended or adjusted under 35 U.S.C. 154(b) by 225 days.

(21) Appl. No.: 18/197,949

(22) Filed: May 16, 2023

(65) Prior Publication Data

US 2024/0388301 A1    Nov. 21, 2024

(51) Int. Cl.
*H03M 1/06* (2006.01)
*H03M 1/56* (2006.01)

(52) U.S. Cl.
CPC ........... *H03M 1/0604* (2013.01); *H03M 1/56* (2013.01)

(58) Field of Classification Search
CPC .............................. H03M 1/0604; H03M 1/56
USPC .................................. 341/118, 155, 166–167
See application file for complete search history.

(56) References Cited

U.S. PATENT DOCUMENTS

| | | | |
|---|---|---|---|
| 7,075,470 B2 * | 7/2006 | Lee ...................... | H04N 25/75 382/218 |
| 9,450,596 B2 * | 9/2016 | Kim ...................... | H04N 25/75 |
| 9,742,423 B1 | 8/2017 | Abu Hilal | |
| 2020/0373931 A1 | 11/2020 | Omran et al. | |
| 2021/0119638 A1 | 4/2021 | Ghosh et al. | |

FOREIGN PATENT DOCUMENTS

WO        2022094085 A1      5/2022

OTHER PUBLICATIONS

Majidi, R., "Digitally Assisted Techniques for Nyquist Rate Analog-to-Digital Converters," https://digital.wpi.edu/pdfviewer/pn89d679j, Apr. 29, 2015, 112 pages.
Liu, C., et al., "A 12 bit 100 MS/s SAR-Assisted Digital-Slope ADC," IEEE Journal of Solid-State Circuits, vol. 51, No. 12, Dec. 2016, 10 pages.
Shu, Y., et al., "A 5-Bit 500-MS/s Asynchronous Digital Slope ADC With Two Comparators," IEEE Transactions on Circuits and Systems—II: Express Briefs, vol. 65, No. 4, Apr. 2018, 5 pages.
Peng, C., et al., "A 10.7b 300MS/s Two-Step Digital-Slope ADC in 65nm CMOS," IEEE Transactions on Circuits and Systems—I: Regular Papers, vol. 67, No. 9, Sep. 2020, 12 pages.

(Continued)

*Primary Examiner* — Khai M Nguyen
(74) *Attorney, Agent, or Firm* — Edell, Shapiro & Finnan, LLC

(57) ABSTRACT

A method to operate an analog to digital converter. The method may storing a sampled signal of an input voltage on capacitors, of an up ramp generator and of a down ramp generator to obtain a sampled signal, enabling one of the up ramp generator and the down ramp generator based on a sign of the sampled signal, detecting, on the capacitors, a zero crossing of a stepped ramp that is generated in the one of the up ramp generator and the down ramp generator, and generating a digital representation of the sampled signal based on a number of steps in the stepped ramp.

20 Claims, 14 Drawing Sheets

(56) References Cited

OTHER PUBLICATIONS

Harpe, P., "A 0.8-mW 5-bit 250-MS/s Time-Interleaved Asynchronous Digital Slope ADC," IEEE Journal of Solid-State Circuits, vol. 46, No. 11, Nov. 2011, 8 pages.
Ding, M., et al., "A 5bit 1GS/s 2.7mW 0.05mm2 Asynchronous Digital Slope ADC in 90nm CMOS for IR UWB Radio," Conference: Radio Frequency Integrated Circuits Symposium (RFIC), IEEE, RTUIF10, Jun. 2012, 4 pages.

* cited by examiner

| trig_rmp_up/dn | d<0:3> | dneg<0:1> | dout<2:0> |
|---|---|---|---|
| 1/1 | 0000 | 10 | 101 |
| 1/1 | 0000 | 11 | 100 |
| 1/1 | 1000 | 11 | 011 |
| 1/1 | 1100 | 11 | 010 |
| 1/1 | 1110 | 11 | 001 |
| 1/1 | 1111 | 11 | 000 |

Up:

| trig_rmp_up/dn | d<0:3> | dneg<0:1> | dout<2:0> |
|---|---|---|---|
| 1/1 | 0000 | 10 | 010 |
| 1/1 | 0000 | 11 | 011 |
| 1/1 | 1000 | 11 | 100 |
| 1/1 | 1100 | 11 | 101 |
| 1/1 | 1110 | 11 | 110 |
| 1/1 | 1111 | 11 | 111 |

Dn:

FIG.13

UNIT CAPACITOR-BASED RAMP ANALOG-TO-DIGITAL CONVERTER

TECHNICAL FIELD

The present disclosure relates to circuitry for an analog-to-digital converter.

BACKGROUND

In the era of electronic connectivity, wireline speed has been a key factor in performance improvements of computer and communication systems. Specifically, electrical, optical, long haul, and short reach interconnects have increased their aggregate bandwidth significantly over the past several years. This trend has driven the usage of multi-level modulation schemes, such as PAM4. As a result, the efficient and effective operation of an analog-to-digital converter (ADC) in a receiver in the communication pathway is of particular importance. An ADC needs to be very fast, have reasonably high resolution, and yet be very power efficient. As such, given the ever-increasing wireline speeds, reducing power consumption in high-speed wireline links, and particularly that of an ADC, is one of the industry's key areas of focus.

BRIEF DESCRIPTION OF THE DRAWINGS

FIG. 13 is a table that shows the conversion of thermometer coded output to a binary output for the unit capacitor-based ramp ADC, according to an example embodiment.

DETAILED DESCRIPTION

Overview

A method to operate an analog to digital converter is presented. The method may include storing a sampled signal of an input voltage on capacitors, of an up ramp generator and of a down ramp generator to obtain a sampled signal, enabling one of the up ramp generator and the down ramp generator based on a sign of the sampled signal, detecting, on the capacitors, a zero crossing of a stepped ramp that is generated in the one of the up ramp generator and the down ramp generator, and generating a digital representation of the sampled signal based on a number of steps in the stepped ramp.

Another method to operate an analog to digital converter is presented. The method may include receiving a signal to be sampled as a sampled signal, storing the sampled signal across first plates of multiple capacitors, triggering a first one of a string of series-connected inverters, wherein second plates of the multiple capacitors are respectively connected to outputs of every second series-connected inverter among the string of series-connected inverters, detecting a zero crossing of a stepped ramp generated in coordination with the multiple capacitors and the string of series-connected inverters, and generating a digital representation of the sampled signal that is based on a number of steps in the stepped ramp.

In another embodiment, a device is provided. The device may include an up ramp generator, a down ramp generator, a first sampling switch and a second sampling switch respectively connected to an input of the up ramp generator and to an input of the down ramp generator, a comparator in communication with each of the up ramp generator and the down ramp generator, the comparator configured to trigger operation of one of the up ramp generator and the down ramp generator, wherein each of the up ramp generator and the down ramp generator is configured, upon being triggered by the comparator, to: detect a zero crossing of a stepped ramp that is generated in the one of the up ramp generator and the down ramp generator; and generate a digital representation of the sampled signal based on a number of steps in the stepped ramp.

Example Embodiments

Figure 1:
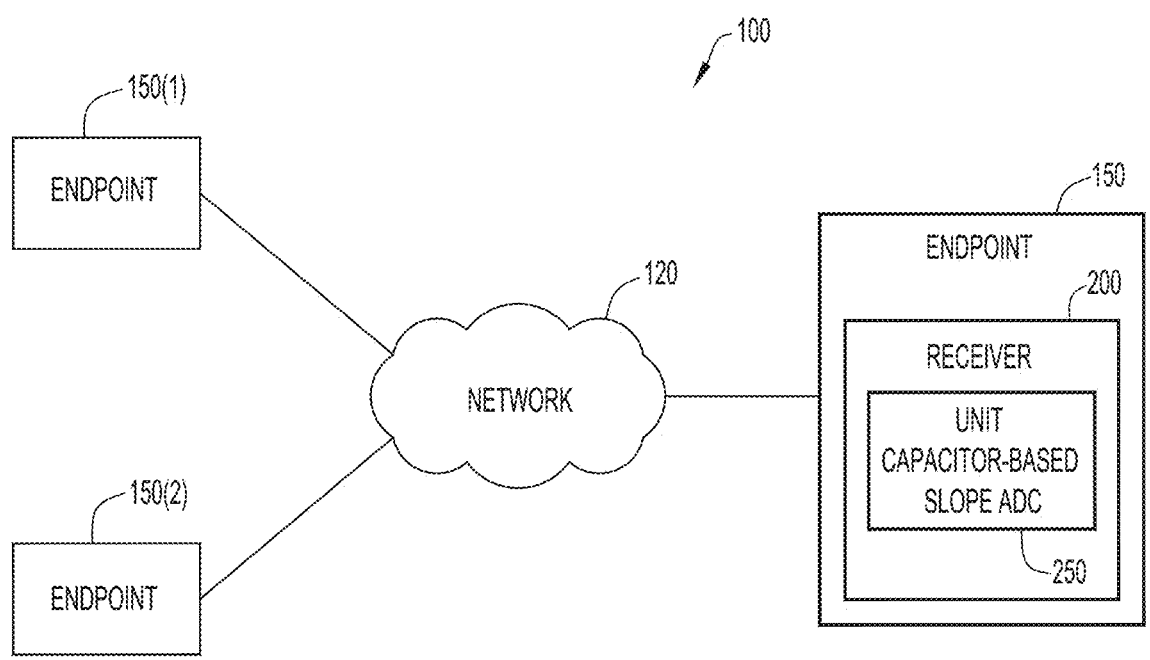
FIG. 1 shows a network having a plurality of endpoints that may be in communication with one another via a network, and where a unit capacitor-based ramp ADC is hosted by at least one receiver of at least one of the endpoints, according to an example embodiment.

FIG. 1 shows a network 100 having a plurality of endpoints designated, e.g., as endpoint 150, endpoint 150(1), and endpoint 150(2) that may be in communication with one another via a network 120. A receiver 200 is shown as being hosted by endpoint 150, and receiver 200 may include unit capacitor-based ramp ADC 250. Receiver 200 may also operate as part of a transceiver. For example, receiver 200 may be part of a network interface card that operates to physically connect to a wireline connection for receiving and transmitting operations. Endpoints 150(1) and 150(2) may be configured similar to endpoint 150. As those skilled in the art will come to appreciate, unit capacitor-based ramp ADC 250 provides power efficient analog-to-digital conversion functionality.

Figure 2:
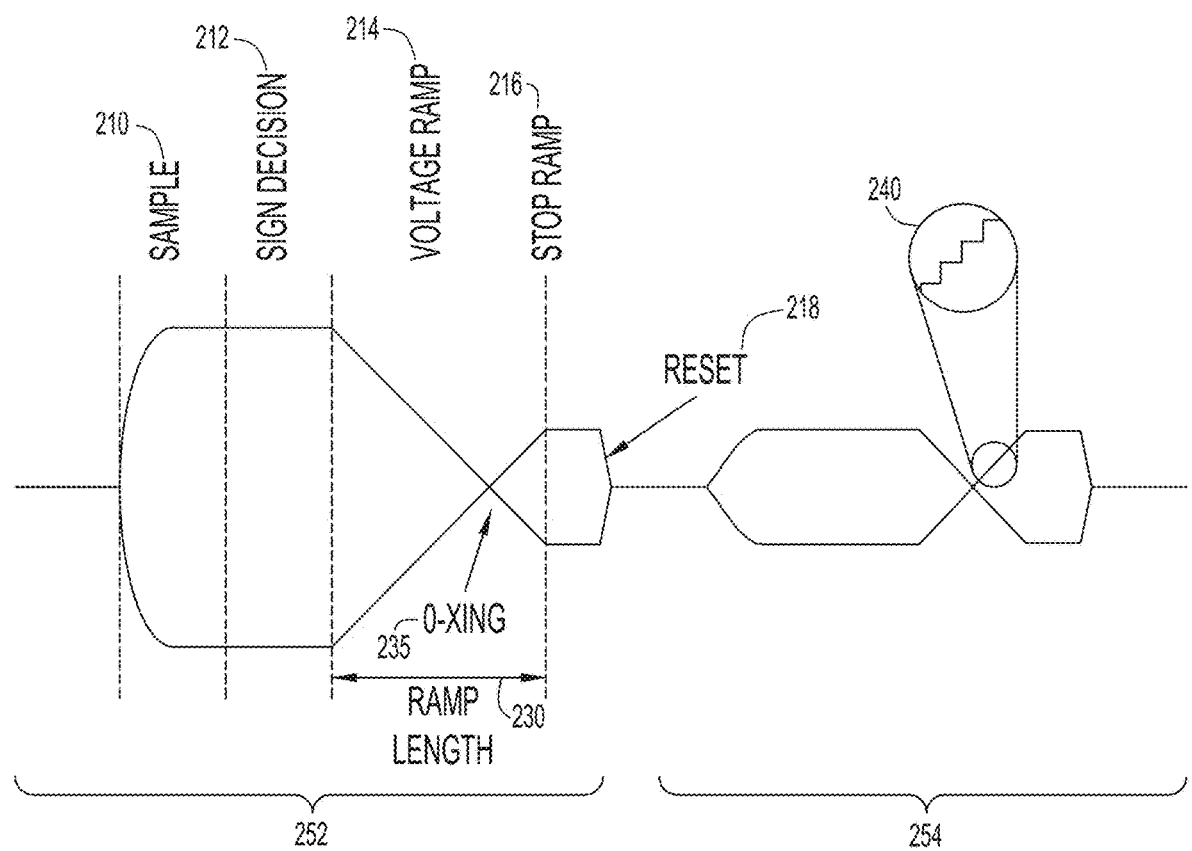
FIG. 2 is a diagram that depicts the working principle of the unit capacitor-based ramp ADC, according to an example embodiment.

FIG. 2 is a diagram that depicts the working principle of the unit capacitor-based ramp ADC 250, according to an example embodiment. Two sampling cycles, 252, 254 are shown in the figure. At 210, an analog signal is sampled across a plurality of unit value sampling capacitors. At 212, an operation determines a sign of the resulting sampled signal. It is noted that the embodiments described herein may be implemented differentially or single ended. In both cases, the sign of the signal may be first determined. The determined sign is then used to select an appropriate part of a circuit (described with reference to FIGS. 3-6) that includes a series of inverters that cause a voltage ramp, shown at 214, to be generated as each unit value capacitor is (dis)charged. The ramp is, in fact, generated as a series of steps corresponding to charge added or charge subtracted from each unit value capacitor as depicted by steps 240 in cycle 254, as each successive pair of inverters is switched.

Eventually, the ramp will reach a zero crossing at 235 (i.e., the point at which the top (e.g., first) plates of the capacitors are fully balanced against the charge added or removed from the bottom (e.g., second) plates of the capacitors via the inverters) indicating that the sampled charge across the unit value capacitors has been fully compensated, i.e., zeroed out. The inverters are thereafter disabled, i.e., the ramp is stopped at 216. However, in some implementations it is possible to continue the ramp, but store a state of the ramp (i.e., the number of inverters switched) at the time of zero crossing, or after some predetermined amount of time thereafter. The number of unit value capacitors switched (or ramp length 230) is proportional to the magnitude of the sampled analog signal. At 218, the circuit is reset for a next sampling operation at cycle 254.

A more detailed explanation of a circuit topology and operation of the unit capacitor-based ramp ADC 250 follows with reference to FIGS. 3-6.

Figure 3:
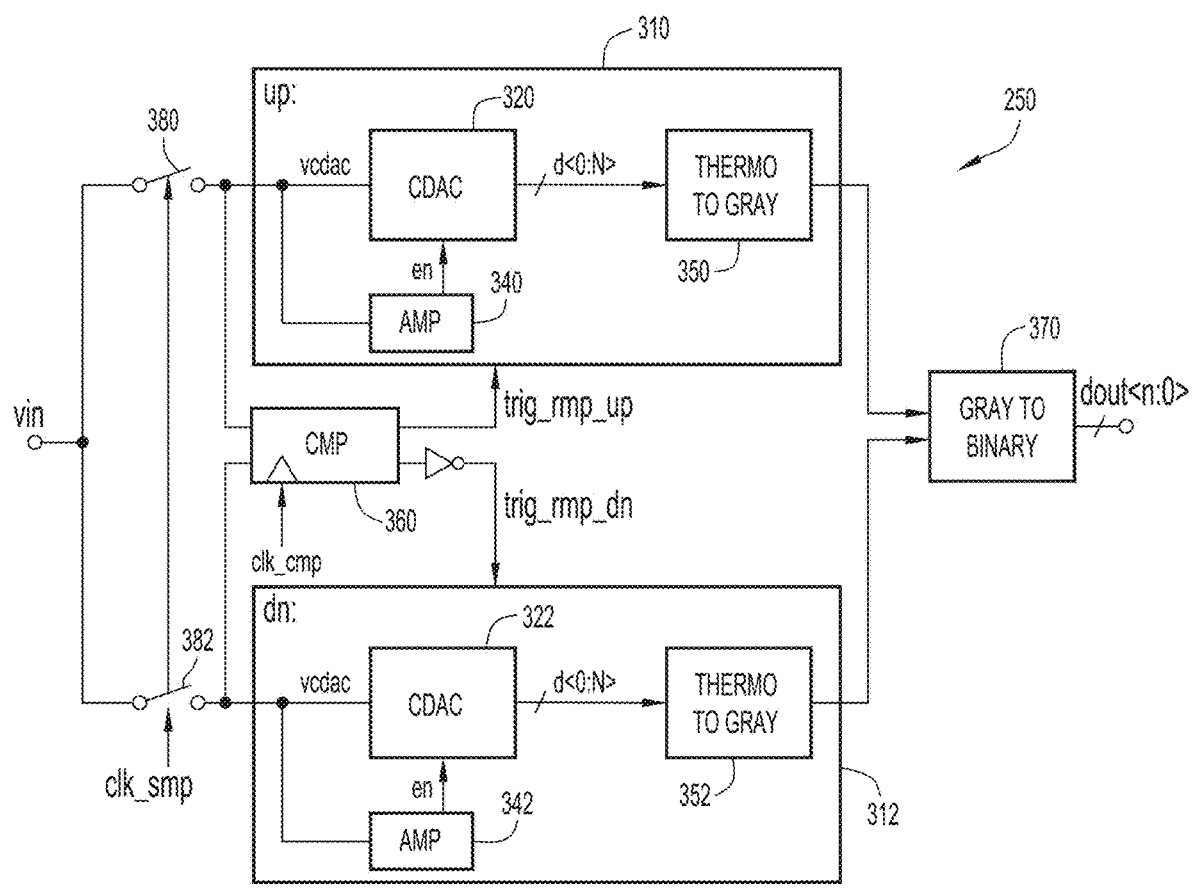
FIG. 3 is a block diagram of the unit capacitor-based ramp ADC, according to an example embodiment.

FIG. 3 is a block diagram of the unit capacitor-based ramp ADC 250, according to an example embodiment. Unit capacitor-based ramp ADC 250 includes an up ramp generator 310 and a down ramp generator 312. Up ramp generator 310 includes a capacitance digital to analog converter, or CDAC 320, an amplifier 340 and a thermo-to-gray converter 350. Similarly, down ramp generator 312 includes a CDAC 322, an amplifier 342 and a thermo-to-gray converter 352. A comparator 360 is in communication with each of up ramp generator 310 and a down ramp generator 312 and is configured to determine whether the analog signal applied at Vin (i.e., vcdac) is positive or negative. Although not shown, comparator 360 also includes an input for a reference signal to which the analog signal Vin is compared. The sign determination controls whether up ramp generator 310 or down ramp generator 312 is enabled. An output of each of thermo-to-gray converter 350 and thermo-to-gray converter 352 is connected to a gray-to-binary converter 370. An analog signal to be sampled and converted to a digital output is supplied at Vin via sampling switches 380, 382 to each of CDAC 320 and CDAC 322 as vcdac. Amplifiers 340, 342, which may also be considered zero-crossing detectors, monitor vcdac and provide an enable signal to CDAC 320 or CDAC 322 as appropriate, as will be explained further below.

Figure 4:
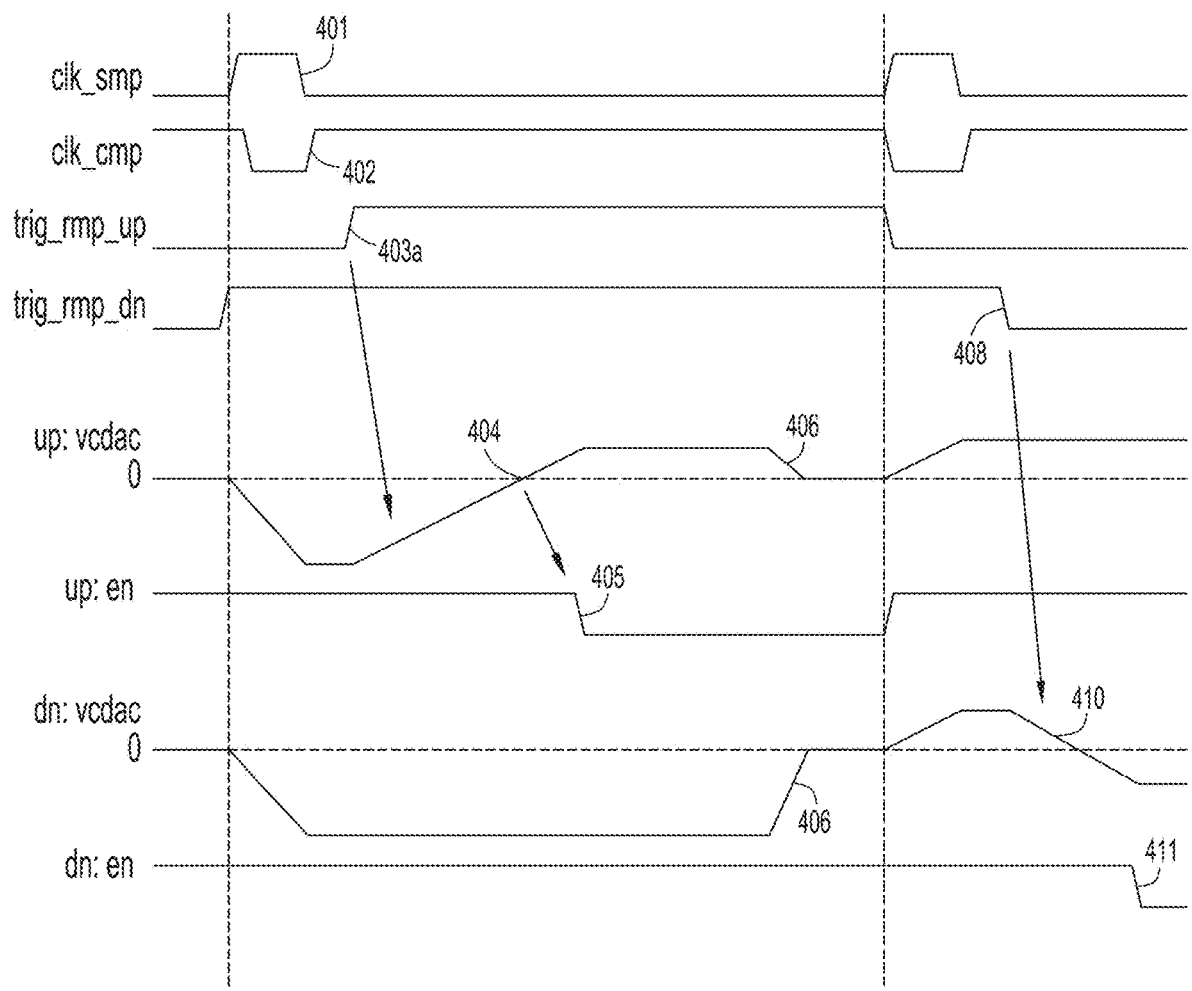
FIG. 4 is a timing diagram that illustrates the operation of the unit capacitor-based ramp ADC, according to an example embodiment.

FIG. 4 is a timing diagram that illustrates the operation of the unit capacitor-based ramp ADC 250, according to an example embodiment. At 401, a sampling clock signal (clk_smp) controls switches 380, 382 to sample voltage Vin, which is designated as voltage vcdac. At 402, comparator clock signal (clk_cmp) for comparator 360 causes comparator 360 to detect the sign (positive or negative) of vcdac. The comparator may use a reference voltage (not shown) against which to compare a voltage level of vcdac. Or, in a differential implementation, the sign is detected by comparing the differential signals to one another.

At 403a, if comparator 360 determines that the voltage vcdac is negative, then up ramp generator 310 is enabled, amplifier 340 is configured to send an enable signal "en" to a plurality of series-connected inverters (shown in FIG. 5), and a rising ramp is triggered with trig_rmp_up. In an embodiment, trig_rmp_up is reset to low and trig_rmp_dn is reset to high at the beginning of each sample. They are opposite to generate an up or down ramp respectively. A rising edge of trig_rmp_up (while trig_rmp_dn stays constant) starts the up ramp. A falling edge of trig_rmp_dn starts the down ramp. As will become more apparent in connection with the explanation of FIG. 5, enable signal en rises at the beginning of the sampling. With enable signal en high the bottom plates of unit value capacitors 510(1), 510(2), 510(3) are charged (to low or high) while the top plates is charged with the input signal (i.e., vcdac). Bottom plates of capacitors 510(1), 510(2), 510(3) are charged to low when trig_rmp_up is low, and charged to high when trig_rmp_dn is high. In one implementation, enable signal en enables/freezes the operation of the inverter chain shown in FIG. 5, but does not trigger the ramp. The ramp is triggered with trig_rmp_up/dn.

The vcdac initial negative voltage is depicted at up:vcdac in line with sampling clock signal clk_smp. As the ramp slopes up over time, it will eventually hit a zero crossing at 404, which is detected by amplifier 340. At this point, as shown at 405, the enable en signal for the up ramp generator 310 goes low to disable the plurality of series-connected inverters. That is, a falling edge of enable signal en freezes the state of the ramp. A state of d<0:N> (see FIG. 5) determines a digital thermometer code corresponding to the voltage vcdac.

At 406, vcdac is reset to zero, to await a new sample via switches 380, 382.

In the event comparator 360 detects a positive sign for vcdac, then a trig_rmp_dn signal is toggled at 408 to initiate a down or falling ramp with down ramp generator 312, which will likewise eventually lead to a zero crossing at 410, which will then, in this case, cause amplifier 342 to disable the plurality of series connected inverters in CDAC 322 via disabling the dn: en signal at 411.

Figure 5:
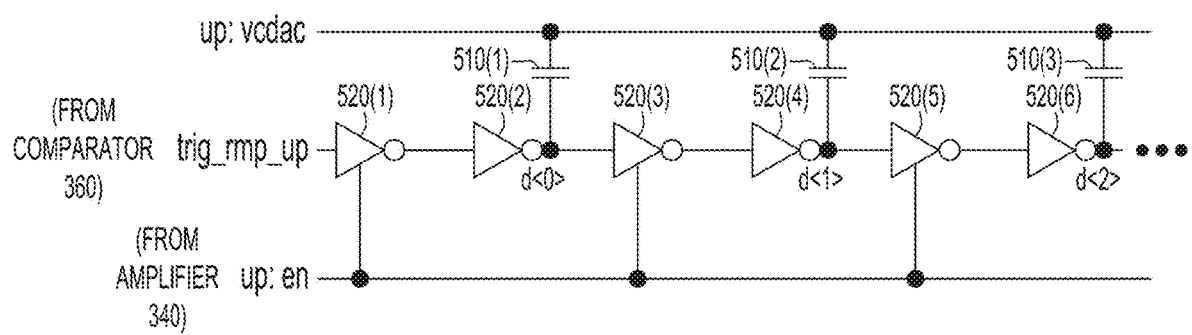
FIG. 5 is a schematic diagram of a portion of the unit capacitor-based ramp ADC, according to an example embodiment.
Figure 6:
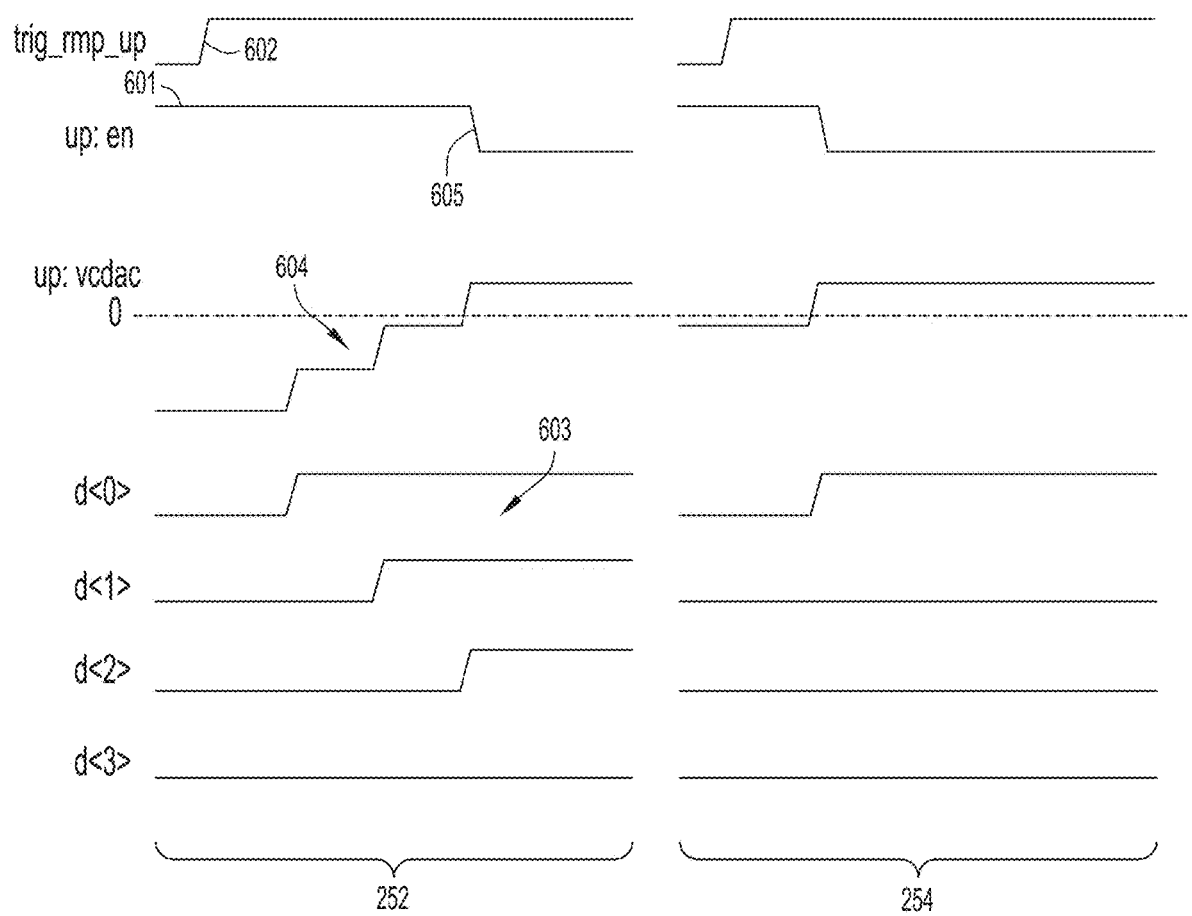
FIG. 6 is another timing diagram that illustrates the operation of the unit capacitor-based ramp ADC, according to an example embodiment.

FIG. 5 is a schematic diagram of a portion of the unit capacitor-based ramp ADC, according to an example embodiment, and FIG. 6 is another timing diagram that illustrates the operation of the unit capacitor-based ramp ADC, according to an example embodiment. These figures will be described together. More specifically, FIG. 5 depicts circuitry disposed within CDAC 320 of the up ramp generator 310. Unit value capacitors 510(1), 510(2), 510(3) are arranged in parallel with one another. The analog voltage signal to be converted to a digital output is supplied as designated voltage vcdac to the upper plates of unit value capacitors 510(1), 510(2), 510(3). Those skilled in the art will appreciate that many more such capacitors may be provided. For instance, forty or more such capacitors could be disposed in the fashion shown. More or fewer capacitors may be provided to increase or decrease the dynamic range or resolution of the system. Voltage vcdac, once switches 380, 382 are opened, is thus stored and distributed equally across unit value capacitors 510(1), 510(2), 510(3). In one implementation embodiment, the total capacitance of all of the unit value capacitors 510(1), 510(2), 510(3) is about 20 fF, and each of the unit value capacitors 510(1), 510(2), 510(3) may have a value of about 1-2 fF, or, e.g., 0.1-0.5 fF. Of course, other individual and total capacitance values may be implemented.

In this case, once up ramp generator 310 is selected (and down ramp generator 312 is disabled thus saving power), the en signal is supplied by amplifier 340, effectively powering up the inverters 520(1), 520(2), 520(3), 520(4), 520(5), 520(6), etc. This is also shown at 601 in the timing diagram of FIG. 6. Very soon thereafter, the trig_rmp_up signal is supplied to the first inverter 520(1) (shown at 602), thus causing a ripple of alternating zeros and ones to cascade down the series of inverters 520(1), 520(2), etc. as shown generally at 603, causing an up ramp 604, until the voltage vcdac is zeroed out. As shown in FIG. 3, amplifier 340 is continually monitoring voltage vcdac. And when vcdac crosses zero, i.e., zero voltage is detected by amplifier 340, then as shown at 605, the en signal for the inverters 520(1), 520(2), 520(3), 520, (4), 520(5) goes low, thus ending the ramp.

At that point, the values of d<0>, d<1>, d<2>, d<3> can be taken from the outputs of selected (e.g., every other) inverter, and supplied to thermo-to-gray converter 350 (in this case). The output of thermo-to-gray converter 350 is then supplied to gray-to-binary converter 370, which supplies a value dout <n:0>, which is the digital equivalent of the initial vcdac sampled onto the unit value capacitors 510(1), 510(2), etc.

As shown in FIG. 6, sampling cycle 252 has a longer ramp corresponding to a larger sampled negative voltage compared to sampling cycle 254 which has a shorter ramp corresponding to a smaller negative sample voltage, and thus fewer steps in the (stepped) ramp.

There are several advantages to the unit capacitor-based ramp ADC 250 described herein. For example, there is low parasitic capacitance on the CDAC 320, 322 allowing the sizing of the CDAC 320, 322 to be close to the kT/C limit. The unit capacitor-based ramp ADC 250 employs relatively few circuit elements.

Further, the design may or may not include a buffer (not shown), which drives signal Vin toward sampling switches 380, 382 and CDAC 320, 322. Further, because the unit value capacitors 510(1), 510(2), etc. are small, the power consumption of can be reduced significantly. As the unit capacitor-based ramp ADC 250 is asynchronously clocked, internal clocks may be derived from the external sampling clock.

Those skilled in the art will appreciate that the unit capacitor-based ramp ADC 250 described herein operates in an efficient manner by sampling on two arrays of capacitors, performing a clocked comparator decision, based on the comparator decision disable one of two arrays of capacitors, switch the capacitors of the selected array of capacitors in a sequence, using, e.g., inverters, without the need for an external clocking mechanism, that function as a continuous time comparator (which is not externally clocked), and when the continuous time comparator senses a zero-crossing, disable the switching of the capacitors inside the selected array of capacitors. The number of capacitors switched (minus, perhaps, an offset together with the sign decision) defines the digital output representative of the sample input voltage.

As those skilled in the art will further appreciate, the unit capacitor-based ramp ADC 250 comprises two halves for up and down ramping. The sign is decided after sampling. Notably, and in one implementation, the unused half does not consume static power (except, perhaps, some power associated with leakage current). There is also no time penalty due to a large CDAC step to perform a signed to unsigned operation of the sampled signal.

Also, as a result of the disconnected unused half, parasitic capacitance may be reduced up to half, which allows for smaller unit capacitors and thus smaller total sampling capacitance. Further, the total sampling capacitance can be chosen close to the kT/C limit. There is also the advantage that it is possible to perform calibration on unused half and the comparator during conversion without a time penalty.

Figure 7:
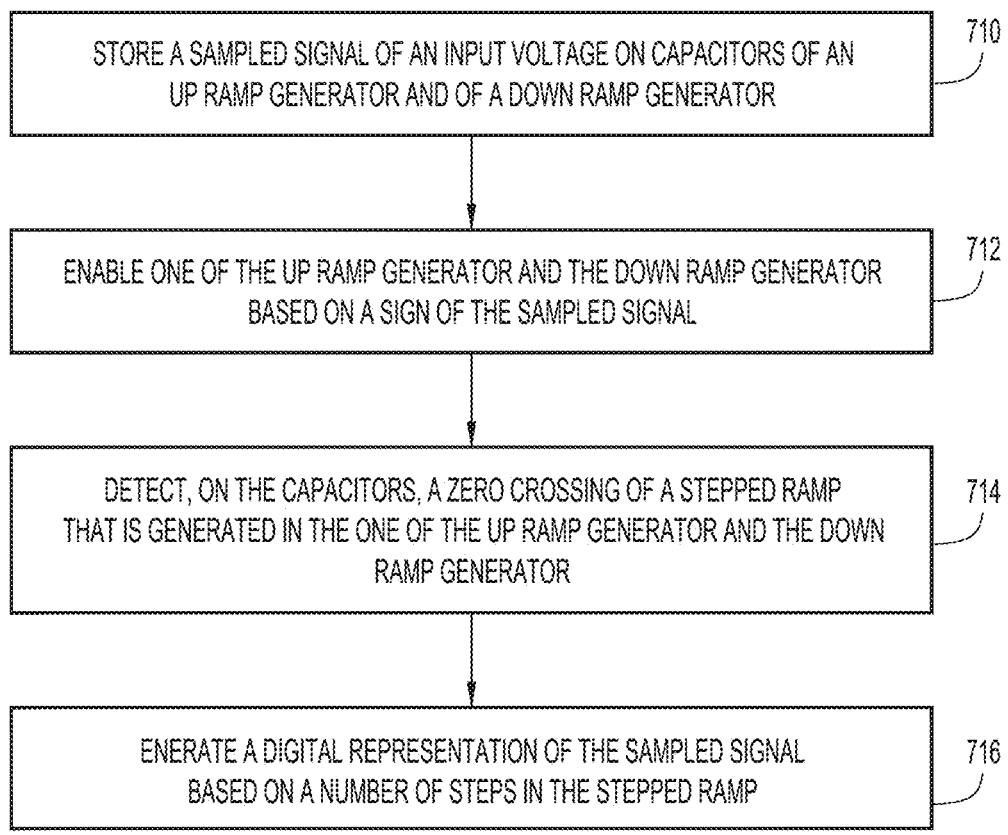
FIG. 7 is flowchart showing a series of operations executed by the unit capacitor-based ramp ADC, according to an example embodiment.

FIG. 7 is flowchart showing a series of operations executed by the unit capacitor-based ramp ADC, according to an example embodiment. At 710, an operation includes storing a sampled signal of an input voltage on capacitors of an up ramp generator and of a down ramp generator to obtain a sampled signal. At 712, an operation includes enabling one of the up ramp generator and the down ramp generator based on a sign of the sampled signal. At 714, an operation includes detecting, on the capacitors, a zero crossing of a stepped ramp that is generated in the one of the up ramp generator and the down ramp generator. And, at 716, an operation includes generating a digital representation of the sampled signal based on a number of steps in the stepped ramp.

Figure 8:
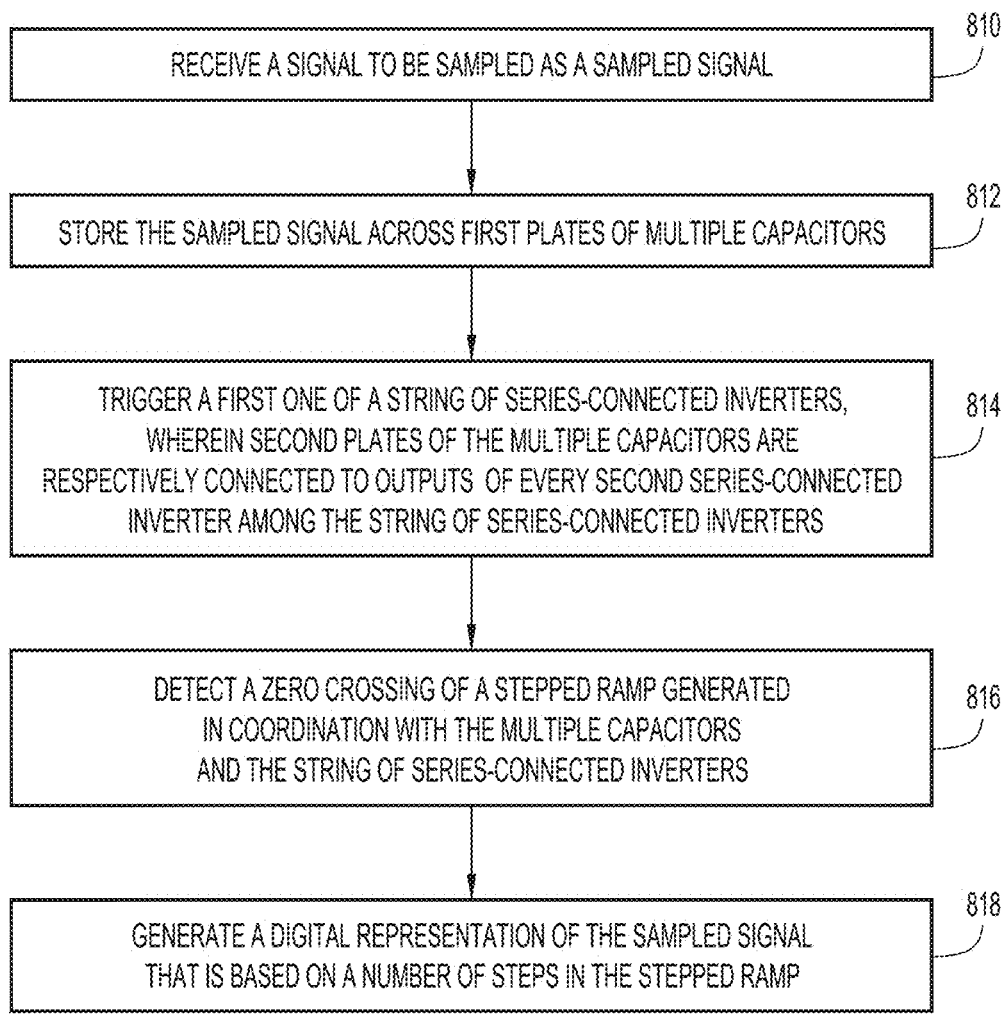
FIG. 8 is flowchart showing another series of operations executed by the unit capacitor-based ramp ADC, according to an example embodiment.

FIG. 8 is flowchart showing another series of operations executed by the unit capacitor-based ramp ADC, according to an example embodiment. At 810, an operation includes receiving a signal to be sampled as a sampled signal, e.g., delivered via a sampling switch. At 812, an operation includes storing the sampled signal across first plates of multiple capacitors. At 814, an operation includes triggering a first one of a string of series-connected inverters, wherein second plates of the multiple capacitors are respectively connected to outputs of every second series-connected inverter among the string of series-connected inverters. At 816, an operation includes detecting a zero crossing of a stepped ramp generated in coordination with the multiple capacitors and the string of series-connected inverters. And, at 818, an operation includes generating a digital representation of the sampled signal that is based on a number of steps in the stepped ramp.

Figure 9:
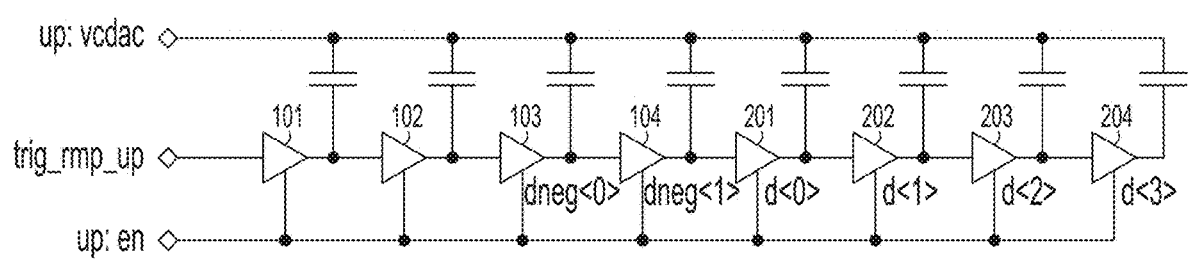
FIG. 9 is a more detailed schematic diagram of a portion of the unit capacitor-based ramp ADC, according to an example embodiment.

FIG. 9 is a more detailed schematic diagram of a portion of the unit capacitor-based ramp ADC 250, according to an example embodiment. More specifically, FIG. 9 shows a schematic example of the (up) CDAC 320. In this case, eight delay stages or inverter stages 101, 102, 103, 104, 201, 202, 203 and 204, each including two inverters and one unit capacitor. Output d<0:3> represents the magnitude of the sampled voltage in thermometer coding. Additional stages are employed to compensate for the delay between the real zero crossing of vcdac and the enable signal en going low. In this example, the delay corresponds to the delay of four stages (see, e.g., FIG. 10). To provide appropriate time compensation, (at least) four additional inverter stages 101-104 are provided to cover the full scale of the converter.

By using the output of the last few additional inverter stages 103-104, it is possible to represent a negative sampled voltage dneg<0:1> without any penalty on the conversion time, because these stages are already being used to compensate for the delay between the real zero crossing and enable signal en going low. With this added redundancy of representing negative amplitudes, it is possible to recover from a wrong sign decision of comparator 360 by also considering dneg<0:1> when generating the final binary output.

That is, when the sampled signal is close to zero, comparator 360 can make a wrong sign decision due to its noise. Without any way to recover a wrong sign decision, the noise of comparator 360 may be designed such that it is below the quantization noise of the converter. However, this usually means, that comparator 360 may be designed with higher area, more power and/or slower decision time.

By adding the redudancy of representing negative amplitude dneg<0:1>, as shown in FIG. 9, comparator 360 can be designed to allow more room for error in the sign decision. In this example, the negative range covered is two LSBs (least significant bits). Since it is very unlikely for the error to exceed the negative range, the noise of comparator 360 is no longer limiting the overall noise performance of the converter. In this way, comparator 360 can be designed to allow more noise but with lower area, lower power and/or faster decision time. It is also noted that to increase resolution, it is possible to count data from each inverter in a given pair of inverters, And any number of inverters my deployed between unit capacitors.

Figure 10:
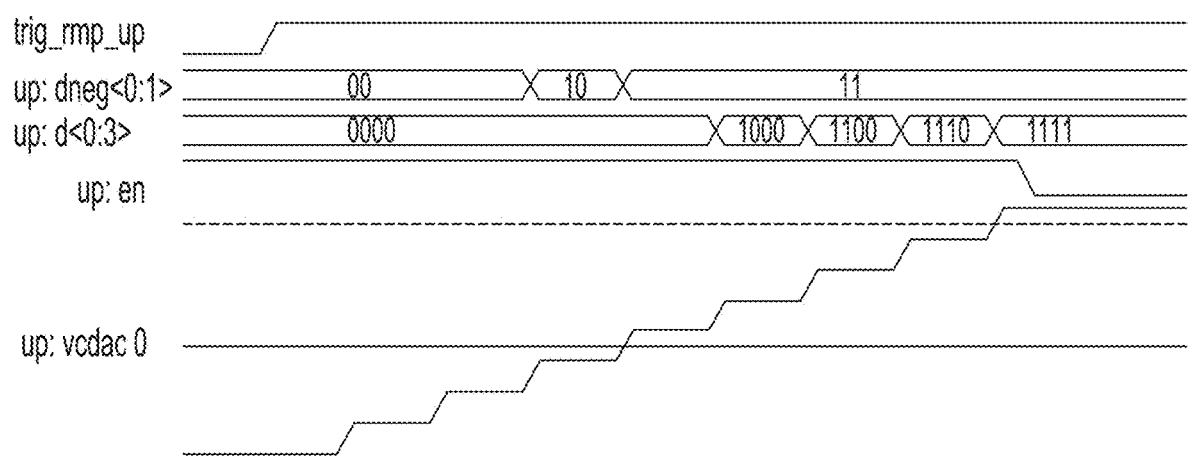
FIG. 10 is a timing diagram that illustrates the operation of the unit capacitor-based ramp ADC consistent with FIG. 9 and having a relatively large negative sampled voltage, according to an example embodiment.

FIG. 10 is a timing diagram that illustrates the operation of the unit capacitor-based ramp ADC consistent with FIG. 9 and having a relatively large negative sampled voltage, according to an example embodiment. That is, FIG. 10 shows a timing diagram in a scenario in which a fullscale negative input voltage is sampled. The up ramp is triggered with trig_rmp_up. After, trig_rmp_up is set to high, each unit time interval vcdac is stepped up by switching a unit capacitor at the output of each stage. Enable signal en is triggered four unit time intervals after vcdac crosses zero, or crosses a voltage reference level represented by the dashed line. In this example, d<0:3>=1111 and represents a high magnitude input voltage.

Figure 11:
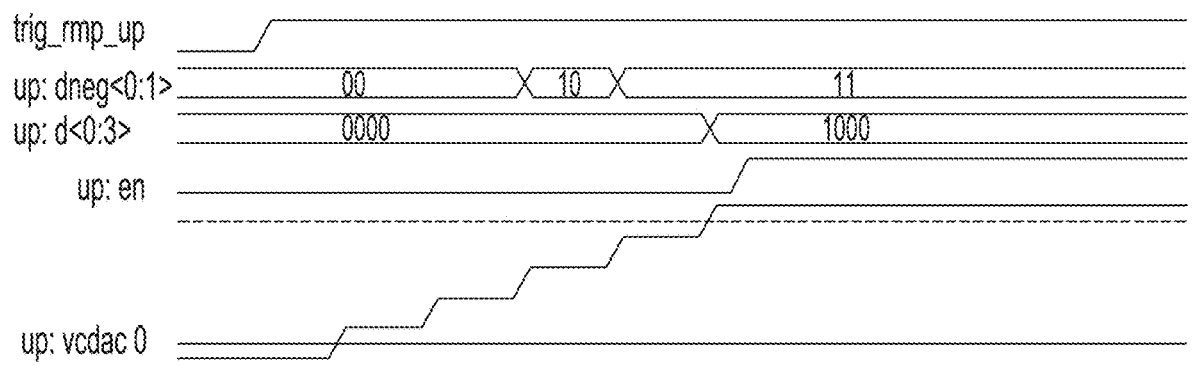
FIG. 11 is a timing diagram that illustrates the operation of the unit capacitor-based ramp ADC consistent with FIG. 9 and having a relatively small negative sampled voltage, according to an example embodiment.

FIG. 11 is a timing diagram that illustrates the operation of the unit capacitor-based ramp ADC consistent with FIG. 9 and having a relatively small negative sampled voltage, according to an example embodiment. That is, FIG. 11 shows a timing diagram in a scenario in which a small negative input voltage is sampled. After, trig_rmp_up is set to high, each unit time interval vcdac is stepped up by switching a unit capacitor at the output of each stage. Enable signal en is triggered four unit time intervals after vcdac crosses zero. This stops the progression of the ramp and the output d<0:3>=1000 represents a low magnitude input voltage.

Figure 12:
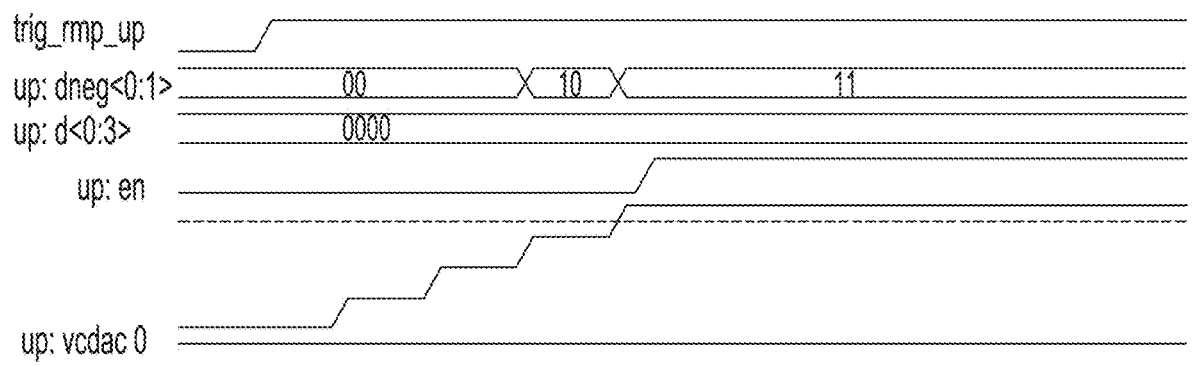
FIG. 12 is a timing diagram that illustrates the operation of the unit capacitor-based ramp ADC consistent with FIG. 9 and having a relatively small positive sampled voltage, and where a wrong sign was determined, according to an example embodiment.

FIG. 12 is a timing diagram that illustrates the operation of the unit capacitor-based ramp ADC consistent with FIG. 9 and having a relatively small positive sampled voltage, and where a wrong sign was determined, according to an example embodiment. More specifically, FIG. 12 shows a timing diagram in a scenario in which a small positive input voltage is sampled. Here, the sign decision is wrong and the up ramp was triggered instead of the down ramp. After, trig_rmp_up is set to high, each unit time interval vcdac is stepped up by switching a unit capacitor at the output of each stage. Vcdac never crosses zero but enable signal en is triggered at the same voltage level in each of FIGS. 10 and 11. This stops the progression of the ramp and the output d<0:3>=0000 represents a negative input voltage. In this case, dneg<0:1> represents the magnitude of the sampled negative voltage with thermometer coding.

FIG. 13 is a table that shows the conversion of thermometer coded output to a binary output for the unit capacitor-based ramp ADC, according to an example embodiment. The table of FIG. 13 shows the conversion of the thermometer coded output dneg<0:1> and d<0:3> to the binary output dout<2:0> in the example given in FIG. 9. Using the redundancy of dneg<0:1> when converting the final binary output dout<2:0>, a wrong sign decision can still be recovered, even when the wrong ramp was triggered due to a sampled input voltage with small magnitude. The sign is determined by comparator 360, which sets trig_rmp_up/dn=0/0 or 1/1. A positive amplitude is given by d<0:3> when d<0:3> has at least one "1." A negative amplitude is given by dneg<0:1> when d<0:3> is all zero.

Figure 14:
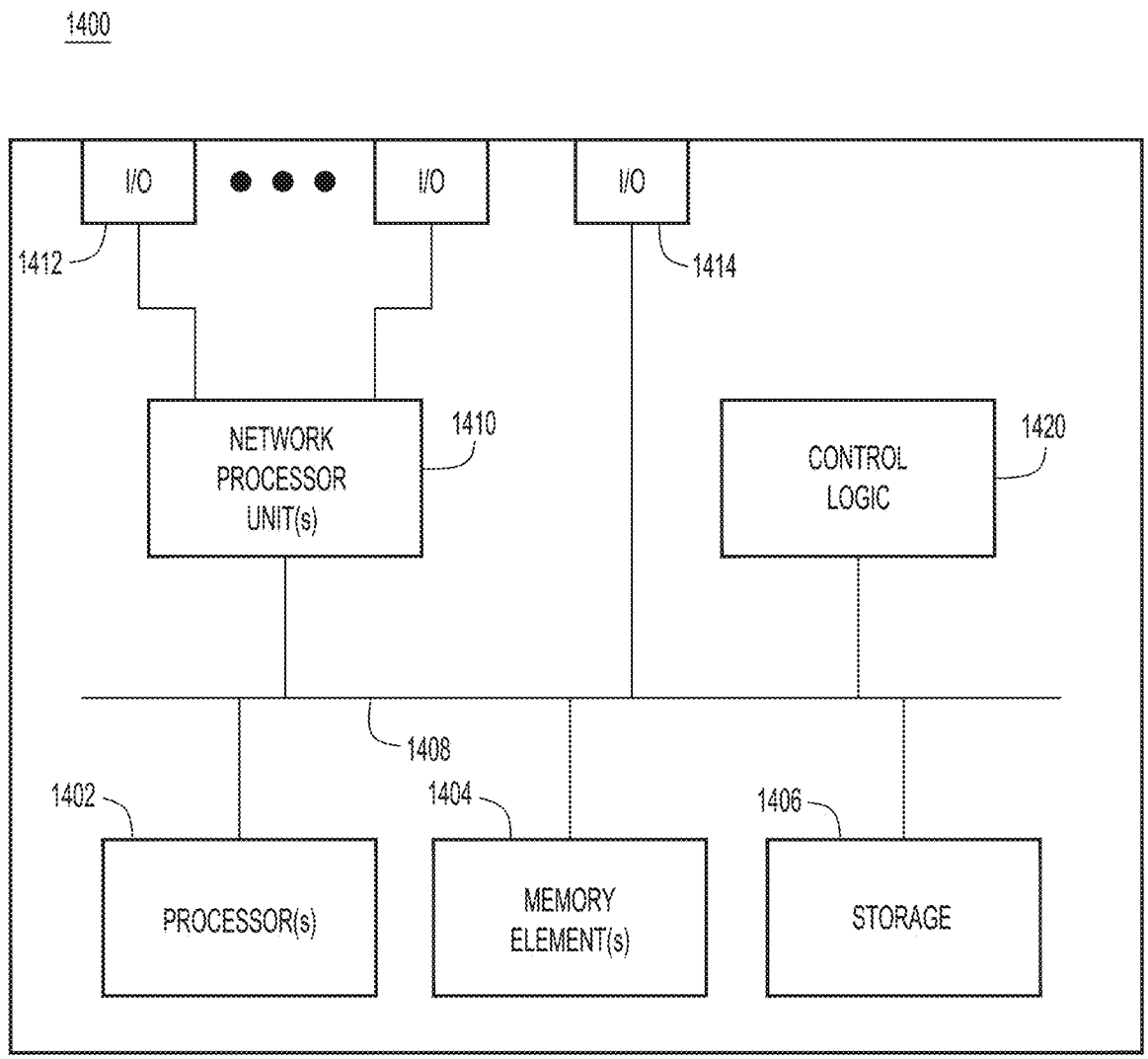
FIG. 14 is a block diagram of a computing device that may incorporate the unit capacitor-based ramp ADC, and perform the techniques described herein, according to an example embodiment.

FIG. 14 is a block diagram of a computing device that may incorporate the unit capacitor-based ramp ADC 250, and perform the techniques described herein, according to an example embodiment. In various embodiments, a computing device, such as computing device 1400 or any combination of computing devices 1400, may be configured as any entity/entities as discussed for the techniques depicted in connection with FIGS. 1-13 in order to perform operations of the various techniques discussed herein.

In at least one embodiment, the computing device 1400 may include one or more processor(s) 1402, one or more memory element(s) 1404, storage 1406, a bus 1408, one or more network processor unit(s) 1410 interconnected with one or more network input/output (I/O) interface(s) 1412, one or more I/O interface(s) 1414, and control logic 1420. In various embodiments, instructions associated with logic for computing device 1400 can overlap in any manner and are not limited to the specific allocation of instructions and/or operations described herein.

In at least one embodiment, processor(s) 1402 is/are at least one hardware processor configured to execute various tasks, operations and/or functions for computing device 1400 as described herein according to software and/or instructions configured for computing device 1400. Processor(s) 1402 (e.g., a hardware processor) can execute any type of instructions associated with data to achieve the operations detailed herein. In one example, processor(s) 1402 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, memory element(s) 1404 and/or storage 1406 is/are configured to store data, information, software, and/or instructions associated with computing device 1400, and/or logic configured for memory element(s) 1404 and/or storage 1406. For example, any logic described herein (e.g., control logic 1420) can, in various embodiments, be stored for computing device 1400 using any combination of memory element(s) 1404 and/or storage 1406. Note that in some embodiments, storage 1406 can be consolidated with memory element(s) 1404 (or vice versa) or can overlap/exist in any other suitable manner.

In at least one embodiment, bus 1408 can be configured as an interface that enables one or more elements of computing device 1400 to communicate in order to exchange information and/or data. Bus 1408 can be implemented with any architecture designed for passing control, data and/or information between processors, memory elements/storage, peripheral devices, and/or any other hardware and/or software components that may be configured for computing device 1400. In at least one embodiment, bus 1408 may be implemented as a fast kernel-hosted interconnect, potentially using shared memory between processes (e.g., logic), which can enable efficient communication paths between the processes.

In various embodiments, network processor unit(s) 1410 may enable communication between computing device 1400 and other systems, entities, etc., via network I/O interface(s) 1412 (wired and/or wireless) to facilitate operations discussed for various embodiments described herein. In various embodiments, network processor unit(s) 1410 can be configured as a combination of hardware and/or software, such as one or more Ethernet driver(s) and/or controller(s) or interface cards, Fibre Channel (e.g., optical) driver(s) and/or controller(s), wireless receivers/transmitters/transceivers, baseband processor(s)/modem(s), and/or other similar network interface driver(s) and/or controller(s) now known or hereafter developed to enable communications between computing device 1400 and other systems, entities, etc. to facilitate operations for various embodiments described herein. In various embodiments, network I/O interface(s) 1412 can be configured as one or more Ethernet port(s), Fibre Channel ports, any other I/O port(s), and/or antenna(s)/antenna array(s) now known or hereafter developed. Thus, the network processor unit(s) 1410 and/or network I/O interface(s) 1412 may include suitable interfaces for receiving, transmitting, and/or otherwise communicating data and/or information in a network environment.

I/O interface(s) 1414 allow for input and output of data and/or information with other entities that may be connected to computing device 1400. For example, I/O interface(s) 1414 may provide a connection to external devices such as a keyboard, keypad, a touch screen, and/or any other suitable input and/or output device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a computer monitor, a display screen, or the like.

In various embodiments, control logic 1420 can include instructions that, when executed, cause processor(s) 1402 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof, and/or the like to facilitate various operations for embodiments described herein.

The programs described herein (e.g., control logic 1420) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, entities as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, memory element(s) 1404 and/or storage 1406 can store data, software, code, instructions (e.g., processor instructions), logic, parameters, combinations thereof, and/or the like used for operations described herein. This includes memory element(s) 1404 and/or storage 1406 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

Variations and Implementations

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio- Frequency Identification (RFID), Near Field Communication (NFC), Bluetooth™ mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

Communications in a network environment can be referred to herein as 'messages', 'messaging', 'signaling', 'data', 'content', 'objects', 'requests', 'queries', 'responses', 'replies', etc. which may be inclusive of packets. As referred to herein and in the claims, the term 'packet' may be used in a generic sense to include packets, frames, segments, datagrams, and/or any other generic units that may be used to transmit communications in a network environment. Generally, a packet is a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

In sum a method is provided. The method may include storing a sampled signal of an input voltage on capacitors of an up ramp generator and of a down ramp generator, enabling one of the up ramp generator and the down ramp generator based on a sign of the sampled signal, detecting, on the capacitors, a zero crossing of a stepped ramp that is generated in the one of the up ramp generator and the down ramp generator, and generating a digital representation of the sampled signal based on a number of steps in the stepped ramp.

In the method, the capacitors may be part of an array of unit value capacitors.

The method may further include enabling the one of the up ramp generator and the down ramp generator by enabling a plurality of inverters connected in series in the one of the up ramp generator and the down ramp generator.

The method may further include initiating the stepped ramp by triggering a first inverter in the plurality of inverters connected in series.

The method may further include generating the digital representation of the sampled signal by detecting states of respective inverters in the plurality of inverters, after detecting the zero crossing.

In the method, detecting the zero crossing may include monitoring a voltage across first plates of a plurality of unit value capacitors on which the sampled signal is initially stored.

The method may further include determining the sign of the sampled signal using a comparator.

The method may further include converting the digital representation of the sampled signal with a thermo-to-gray converter.

The method may further include converting an output of the thermo-to-gray converter with a gray-to-binary converter.

The method may further include not enabling another of the one of the up ramp generator and the down ramp generator.

Another method may include receiving a signal to be sampled as a sampled signal, storing the sampled signal across first plates of multiple capacitors, triggering a first one of a string of series-connected inverters, wherein second plates of the multiple capacitors are respectively connected to outputs of every second series-connected inverter among the string of series-connected inverters, detecting a zero crossing of a stepped ramp generated in coordination with the multiple capacitors and the string of series-connected inverters, and generating a digital representation of the sampled signal that is based on a number of steps in the stepped ramp.

In the method, the multiple capacitors may be part of an array of unit value capacitors.

The method may further include generating the digital representation of the sampled signal by detecting states of respective inverters in the string of series-connected inverters, after detecting the zero crossing.

In the method, detecting the zero crossing may include monitoring a voltage across the first plates of the multiple capacitors on which the sampled signal is initially stored.

In the method, the multiple capacitors may be unit value capacitors.

The method may further include converting the digital representation of the sampled signal with a thermo-to-gray converter.

The method may further include converting an output of the thermo-to-gray converter with a gray-to-binary converter.

A device may also be provided. The device may include an up ramp generator, a down ramp generator, a first sampling switch and a second sampling switch respectively connected to an input of the up ramp generator and to an input of the down ramp generator, and a comparator in communication with each of the up ramp generator and the down ramp generator, the comparator configured to trigger operation of one of the up ramp generator and the down ramp generator, wherein each of the up ramp generator and the down ramp generator is configured, upon being triggered by the comparator, to: detect a zero crossing of a stepped ramp that is generated in the one of the up ramp generator and the down ramp generator, and generate a digital representation of a sampled signal based on a number of steps in the stepped ramp.

In the device, each of the up ramp generator and the down ramp generator may include an array of unit value capacitors on which a sampled signal, delivered via the first sampling switch and a second sampling switch, is stored.

In the device, each of the up ramp generator and the down ramp generator may include a plurality of inverters connected in series and from which the digital representation of the sampled signal is taken, after the zero crossing is detected.

Each example embodiment disclosed herein has been included to present one or more different features. However, all disclosed example embodiments are designed to work together as part of a single larger system or method. This disclosure explicitly envisions compound embodiments that combine multiple previously discussed features in different example embodiments into a single system or method.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A method comprising:
   storing a sampled signal of an input voltage on capacitors of an up ramp generator and of a down ramp generator;
   enabling one of the up ramp generator and the down ramp generator based on a sign of the sampled signal;
   detecting, on the capacitors, a zero crossing of a stepped ramp that is generated in the one of the up ramp generator and the down ramp generator; and
   generating a digital representation of the sampled signal based on a number of steps in the stepped ramp.

2. The method of claim 1, wherein the capacitors comprise an array of unit value capacitors.

3. The method of claim 1, further comprising enabling the one of the up ramp generator and the down ramp generator by enabling a plurality of inverters connected in series in the one of the up ramp generator and the down ramp generator.

4. The method of claim 3, further comprising initiating the stepped ramp by triggering a first inverter in the plurality of inverters connected in series.

5. The method of claim 3, further comprising generating the digital representation of the sampled signal by detecting states of respective inverters in the plurality of inverters, after detecting the zero crossing.

6. The method of claim 1, wherein detecting the zero crossing comprises monitoring a voltage across first plates of a plurality of unit value capacitors on which the sampled signal is initially stored.

7. The method of claim 1, further comprising determining the sign of the sampled signal using a comparator.

8. The method of claim 1, further comprising converting the digital representation of the sampled signal with a thermo-to-gray converter.

9. The method of claim 8, further comprising converting an output of the thermo-to-gray converter with a gray-to-binary converter.

10. The method of claim 1, further comprising not enabling another of the one of the up ramp generator and the down ramp generator.

11. A method comprising:
    receiving a signal to be sampled as a sampled signal;
    storing the sampled signal across first plates of multiple capacitors;
    triggering a first one of a string of series-connected inverters, wherein second plates of the multiple capacitors are respectively connected to outputs of every second series-connected inverter among the string of series-connected inverters;
    detecting a zero crossing of a stepped ramp generated in coordination with the multiple capacitors and the string of series-connected inverters; and
    generating a digital representation of the sampled signal that is based on a number of steps in the stepped ramp.

12. The method of claim 11, wherein the multiple capacitors comprise an array of unit value capacitors.

13. The method of claim 11, further comprising generating the digital representation of the sampled signal by detecting states of respective inverters in the string of series-connected inverters, after detecting the zero crossing.

14. The method of claim 11, wherein detecting the zero crossing comprises monitoring a voltage across the first plates of the multiple capacitors on which the sampled signal is initially stored.

15. The method of claim 11, wherein the multiple capacitors are unit value capacitors.

16. The method of claim 11, further comprising converting the digital representation of the sampled signal with a thermo-to-gray converter.

17. The method of claim 16, further comprising converting an output of the thermo-to-gray converter with a gray-to-binary converter.

18. A device comprising:
- an up ramp generator;
- a down ramp generator;
- a first sampling switch and a second sampling switch respectively connected to an input of the up ramp generator and to an input of the down ramp generator; and
- a comparator in communication with each of the up ramp generator and the down ramp generator, the comparator configured to trigger operation of one of the up ramp generator and the down ramp generator, wherein each of the up ramp generator and the down ramp generator is configured, upon being triggered by the comparator, to:
- detect a zero crossing of a stepped ramp that is generated in the one of the up ramp generator and the down ramp generator; and
- generate a digital representation of a sampled signal based on a number of steps in the stepped ramp.

19. The device of claim 18, wherein each of the up ramp generator and the down ramp generator comprises an array of unit value capacitors on which a sampled signal, delivered via the first sampling switch and a second sampling switch, is stored.

20. The device of claim 18, wherein each of the up ramp generator and the down ramp generator comprises a plurality of inverters connected in series and from which the digital representation of the sampled signal is taken, after the zero crossing is detected.

* * * * *